(12) United States Patent
Haukness et al.

(10) Patent No.: US 11,735,262 B2
(45) Date of Patent: *Aug. 22, 2023

(54) ADAPTIVE MEMORY CELL WRITE CONDITIONS

(71) Applicant: Hefei Reliance Memory Limited, Hefei (CN)

(72) Inventors: Brent Haukness, Monte Sereno, CA (US); Zhichao Lu, San Jose, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/698,808

(22) Filed: Mar. 18, 2022

(65) Prior Publication Data
US 2022/0208266 A1    Jun. 30, 2022

Related U.S. Application Data (63) Continuation of application No. 17/081,092, filed on Oct. 27, 2020, now Pat. No. 11,302,394, which is a continuation of application No. 16/334,743, filed as application No. PCT/US2017/052761 on Sep. 21, 2017, now Pat. No. 10,861,544.

(Continued)

(51) Int. Cl.
*G11C 13/00* (2006.01)
*G11C 11/56* (2006.01)

(52) U.S. Cl.
CPC .......... *G11C 13/0069* (2013.01); *G11C 11/56* (2013.01); *G11C 13/004* (2013.01); *G11C 13/0028* (2013.01); *G11C 13/0061* (2013.01); *G11C 2013/0045* (2013.01);

(Continued)

(58) Field of Classification Search
CPC . G11C 13/0069; G11C 11/56; G11C 13/0028; G11C 13/004; G11C 13/0061; G11C 2013/0045; G11C 2013/0076; G11C 2013/0078; G11C 2013/0092;
(Continued)

(56) References Cited

U.S. PATENT DOCUMENTS 7,505,334 B1   3/2009   Breitwisch et al.
8,934,292 B2   1/2015   Costa et al.
(Continued)

FOREIGN PATENT DOCUMENTS

| CN | 102610272 A | 7/2012 |
| CN | 103548085 A | 1/2014 |
| JP | 2005-050424 A | 2/2005 |

OTHER PUBLICATIONS

First Search dated Aug. 16, 2022, issued in related Chinese Application No. 201780058323.8 (2 pages).
(Continued)

*Primary Examiner* — Khamdan N. Alrobaie
(74) *Attorney, Agent, or Firm* — Sheppard Mullin Richter & Hampton LLP (57) ABSTRACT

A method and related apparatus for using an indication of RRAM cell resistance to determine a write condition are disclosed. A cell characteristic of an RRAM cell may be determined to a higher bit resolution than a data read value. A write condition may be selected for the RRAM cell, based on the cell characteristic. The RRAM cell may be written to, using the selected write condition.

20 Claims, 5 Drawing Sheets

Related U.S. Application Data (60) Provisional application No. 62/397,631, filed on Sep. 21, 2016.

(52) U.S. Cl.
CPC ............... *G11C 2013/0076* (2013.01); *G11C 2013/0078* (2013.01); *G11C 2013/0092* (2013.01); *G11C 2213/79* (2013.01)

(58) Field of Classification Search
CPC ............ G11C 2213/79; G11C 11/5678; G11C 2213/82; G11C 7/08
See application file for complete search history.

(56) References Cited

U.S. PATENT DOCUMENTS

| | | | |
|---|---|---|---|
| 2005/0047240 A1* | 3/2005 | Ikehashi | G11C 11/4091 365/222 |
| 2008/0151601 A1* | 6/2008 | Kang | G11C 13/0069 365/189.16 |
| 2008/0225599 A1 | 9/2008 | Chae | |
| 2009/0043951 A1 | 2/2009 | Shalvi et al. | |
| 2009/0129153 A1 | 5/2009 | Sarin et al. | |
| 2010/0058127 A1 | 3/2010 | Terao et al. | |
| 2010/0067281 A1 | 3/2010 | Xi et al. | |
| 2010/0146237 A1 | 6/2010 | Takai | |
| 2010/0165720 A1 | 7/2010 | Lin et al. | |
| 2011/0283039 A1 | 11/2011 | Terao et al. | |
| 2012/0236624 A1 | 9/2012 | Costa et al. | |
| 2013/0250657 A1 | 9/2013 | Haukness et al. | |
| 2014/0258646 A1 | 9/2014 | Goss et al. | |
| 2014/0328123 A1 | 11/2014 | Birk et al. | |
| 2016/0019962 A1 | 1/2016 | Haukness | |
| 2016/0133322 A1 | 5/2016 | Zamir et al. | |
| 2016/0372187 A1* | 12/2016 | Papandreou | G11C 13/004 |
| 2019/0392898 A1 | 12/2019 | Haukness et al. | |

OTHER PUBLICATIONS

Extended European Search Report dated Jul. 30, 2019, issued in related European Patent Application No. 17853911.0 (10 pages).
Examination Report dated Jun. 8, 2020, issued in related European Patent Application No. 17853911.0 (7 pages).
PCT International Preliminary Report on Patentabiity dated Apr. 4, 2019, issued in related International Application No. PCT/US2017/052761 (8 pages).
PCT International Search Report and the Written Opinion dated Dec. 1, 2017, issued in related International Application No. PCT/US2017/052761 (9 pages).
Second Examination Report dated Nov. 30, 2020, issued in related European Patent Application No. 17853911.0 (7 pages).
Non-Final Office Action dated Mar. 18, 2020, issued in related U.S. Appl. No. 16/334,743 (10 pages).
Notice of Allowance dated Jul. 30, 2020, issued in related U.S. Appl. No. 16/334,743 (9 pages).
Non-Final Office Action dated Jul. 22, 2021, issued in related U.S. Appl. No. 17/081,092 (8 pages).

* cited by examiner

ADAPTIVE MEMORY CELL WRITE CONDITIONS

CROSS REFERENCE TO RELATED APPLICATIONS

This application is continuation of U.S. patent application Ser. No. 17/081,092, filed on Oct. 27, 2020, which is a continuation of U.S. patent application Ser. No. 16/334,743, filed on Mar. 19, 2019, now U.S. Pat. No. 10,861,544, entitled "Adaptive Memory Cell Write Conditions", which is a national stage application under 35 U.S.C. § 371 of PCT Application No. PCT/US2017/052761, filed on Sep. 21, 2017, which is based on and claims priority to U.S. Provisional Patent Application No. 62/397,631, filed on Sep. 21, 2016, entitled "Adaptive Write Method for Resistive Random Access Memory." The above-referenced applications are incorporated herein by reference in their entirety.

BACKGROUND

Non-volatile memory is a type of memory device that can store information even after loss of power. Non-volatile memory (NVM) devices can be read only memory or random access memory (RAM) and may use various technologies. One category of non-volatile RAM is resistive RAM, including technologies such as filamentary resistive random access memory (RRAM or ReRAM) cells, interfacial RRAM cells, magnetoresistive RAM (MRAM) cells, phase change memory (PCM) cells (e.g., chalcogenides including alloys of germanium, antimony, and tellurium), memristor memory elements, and programmable metallization cells (e.g., conductive bridging RAM (CBRAM) cell). Turning to RRAM, a resistive filament is formed when the RRAM cell is set, and the resistive filament is broken when the RRAM cell is reset. The resistive filament, when formed, lowers the resistance of the RRAM cell. Thus, each RRAM cell has a low resistance state (LRS) when the filament is formed and a higher resistance state (HRS) when the filament is broken. The LRS and HRS are retained during power off and can represent binary values stored by the RRAM cell. The RRAM cell is a promising non-volatile memory device for embedded and standalone applications due to its fast operation time and low power performance. RRAM cells, however, can demonstrate large resistance variation in the resistance levels of their LRS and the resistance of their HRS. Inevitably, this will lead to some cells having a higher LRS resistance than other cells' HRS resistance, which can create issues during operation. For example, it may be desired to have LRS resistance in the range of K ohm to tens of K ohms, or a tighter range, and HRS resistance in the range of hundreds of K ohms to gig ohms, or a tighter range. The resistance variation can also lead to a wide resistance distribution for intermediate states (IMS) used for multi-level cell states (MLC)). A wide resistance distribution can make memory array design and use difficult.

BRIEF DESCRIPTION OF THE DRAWINGS

The present disclosure will be understood more fully from the detailed description given below and from the accompanying drawings of various embodiments of the disclosure.

DETAILED DESCRIPTION

In the following description, various aspects of the illustrative embodiments will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative embodiments. In other instances, well-known features are omitted or simplified in order not to obscure the illustrative embodiments. Although various embodiments described herein are described with respect to RRAM cells, in other embodiments, these technologies can be used in other memory technologies, both filamentary and non-filamentary. Examples include CBRAM cells, interfacial RRAM cells, MRAM cells, PCM cells, or other programmable metallization cells.

Embodiments of write control for an RRAM cell or RRAM array, including methods and electronic circuits for memory devices, adjust a write condition when writing to the RRAM cell, to control resistivity of the RRAM cell in the high resistance state and/or low resistance state and reduce resistance variation as compared to uncontrolled or unadjusted writing. One goal for such an adaptive write method is to improve resistance distributions and reduce the number of "tail bits" (RRAM cells with undesired resistance values that are out of a desired range for a specific state, i.e., LRS and HRS). Multiple variants of write control are described, including analog feedback and look up table-based embodiments. These variants can include the actions of, determining a characteristic of the RRAM cell relating to RRAM cell resistance, controlling the write condition based on the characteristic of the RRAM cell, and writing to the RRAM cell using the adjusted write condition.

In one embodiment, an RRAM cell in a high resistance state but with resistance at the lower end of the HRS resistance range receives a weaker set condition. An RRAM cell in a high resistance state but with resistance at the higher end of the HRS resistance range receives a stronger set condition. An RRAM cell in a low resistance state but with resistance at the lower end of the LRS resistance range receives a stronger reset condition. And, an RRAM cell in a low resistance state but with resistance at the higher end of the LRS resistance range receives a weaker reset condition.

Control of the write conditions, i.e. the set conditions and reset conditions, acts to reduce the range of resistance in the high resistance state RRAM cells and the range of resistance in the low resistance state RRAM cells. In turn, reducing the ranges of resistance may reduce error, increase noise immunity and/or support more stable read operation for various sense amplifiers over process, voltage and temperature variations, thus improving system reliability for RRAM arrays.

Figure 1:
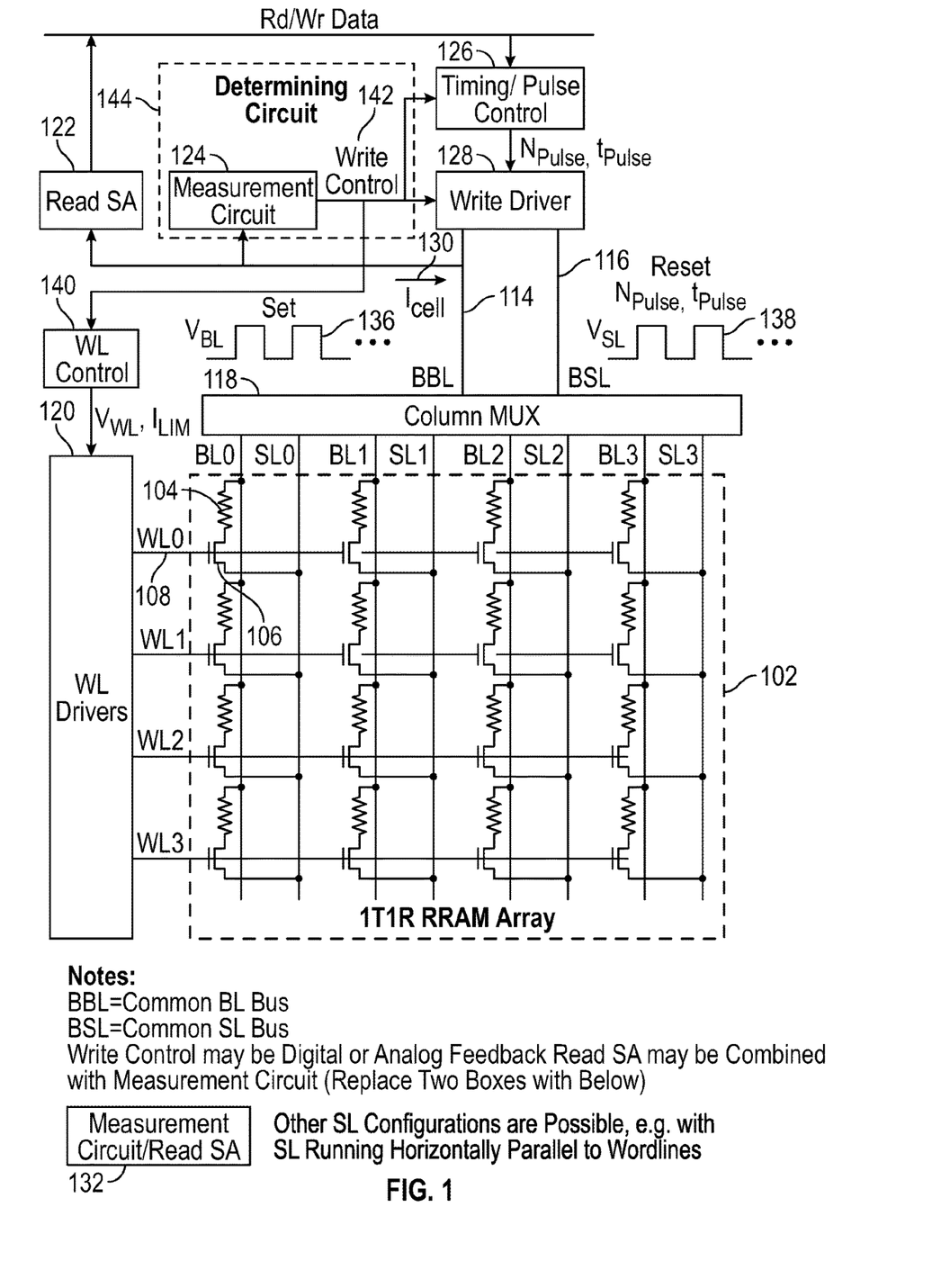
FIG. 1 illustrates an RRAM array with write control, using an indication of RRAM cell resistance to determine a write condition, according to an embodiment.

FIG. 1 illustrates an RRAM array 102 with write control, using an indication of RRAM cell resistance to determine a write condition. A column multiplexer (mux) 118 and word line (WL) drivers 120 select an RRAM cell for reading or writing. Reading determines the existing state of the resistor 104, i.e., resistive filament, in the RRAM cell. Writing to the RRAM cell sets or resets the resistor 104, i.e., programs the resistive state of the resistive filament. In some embodiments, in the RRAM array 102, an RRAM cell is composed of a resistor 104 and a transistor 106, which is an N type metal oxide semiconductor field effect transistor (NMOS FET) in the embodiment shown.

To read the selected RRAM cell, the word line drivers 120 express a read access voltage, controlled by word line control 140, on a selected word line 108, and the read sense amplifier 122 senses the cell current (Icell) 130, or cell voltage in further embodiments. Cell current 130 is directed by the column multiplexer 118, through the common bit line bus 114 (BBL), a selected bit line 110 (e.g., BL0), the selected RRAM cell, the selected source line (e.g., SL0) and the common source line bus (BSL). In one embodiment, the read sense amplifier 122 applies a read voltage to the selected bitline and hence across the selected cell, which generates the read current, i.e., cell current (Icell) 130. The read sense amplifier 122 then senses this cell current (Icell) 130, either through directly measuring or comparing the current, or by other techniques that may involve a voltage discharge, for example.

To write the selected RRAM cell, the word line drivers 120 express a write access voltage, controlled by the word line control 140, on a selected word line 108, and the write driver 128 expresses write voltage and write current across and through the common bit line bus and common source line bus to the selected RRAM cell, as directed by the column multiplexer 118. By controlling word line voltage, write driver 128 output voltage and/or current, or timing of one or more pulses, in various combinations in various embodiments, the programmed resistivity or resistance of the selected RRAM cell (more specifically, the resistor 104) can be controlled.

A measurement circuit 124 determines a characteristic of the selected RRAM cell, related to resistance. In other words, a characteristic of the selected RRAM cell such as a voltage, current or timing is measured, and from this, aspects of cell resistance are inferred and acted upon, or the resistance or a value proportional to the resistance is obtained or estimated, for example by calculation. Typically, the characteristic relates to or is a proxy for the resistance programmed into the RRAM cell, more specifically into the resistor 104, from a previous write operation. This cell characteristic, or measurement, is of a finer resolution than the binary value produced by the read sense amplifier 122, as the data read value of the RRAM cell. The data read value is one bit, for an SLC (single level cell) RRAM cell, and two or more bits for an MLC (multilevel cell) RRAM cell. By contrast, the cell characteristic can be an analog voltage or current of the RRAM cell, or a time value, or digitized value of a voltage, current or time value to a higher bit resolution than the data read value. Voltage and current of the RRAM cell each relate to the resistance of the RRAM cell. In a further embodiment, a voltage is divided by current to obtain resistance, or a value proportional to resistance, of the RRAM cell. Alternatively, current could be divided by voltage to obtain an inverse resistance, or value proportional to inverse resistance, of the RRAM cell. In a still further embodiment, the sense time to read the selected RRAM cell varies with resistance of the RRAM cell and is used as the cell characteristic. Sense time could be represented in an analog value, or digitized. In yet another embodiment, a current could be forced on the bit line and the resulting voltage measured as the characteristic of the selected RRAM cell. These measurements and determinations can be performed using analog circuitry, or analog-to-digital conversion and digital circuitry, in various combinations in various embodiments. Other measurements, measurement circuits and measurement techniques are possible, for determining a cell characteristic that relates to and is a proxy for resistance of the RRAM cell.

Based on the determined cell characteristic, a determining circuit 144, which includes the measurement circuit 124, produces a write control 142. The determining circuit 144 could include analog, digital or mixed circuitry that selects or controls a voltage, a current and/or timing. The write control 142, in the embodiment shown in FIG. 1, is an input to timing/pulse control 126, the write driver 128, and the word line control 140. In further embodiments, the write control 142 could be an input to one or two of the above modules, rather than all three, or could be input to another module that programs resistance of a selected RRAM cell. In variations, the measurement circuit 124 and read sense amplifier 122 can be combined in a measurement circuit/read sense amplifier module 132. Write control 142 can be digital or analog feedback or combined digital and analog feedback, in various embodiments. For all of these versions, the write control 142, whether delivered as an analog signal or set of signals, or digital signal(s) or a parameter, adjusts the voltage expressed across the resistor 104 in the RRAM cell, the current expressed through the resistor 104 in the RRAM cell, timing of one or more set or reset pulses, and/or the word line voltage expressed on the transistor 106 in the RRAM cell (which limits the current through the transistor 106 and the resistor 104 in the RRAM cell). In turn, the controlled, adjusted write condition changes the resistance, i.e., resistive state, of the resistor 104 in the RRAM cell, and controls how little or how much that resistance changes from the former state of the selected RRAM cell.

In various embodiments, the number of set pulses 136 or the number of reset pulses 138 could be controlled, as could pulse width of set pulses 136 or pulse width of reset pulses 138, the voltage of the set pulses 136, i.e., $V_{SL}$ for set pulses 136, the voltage of the reset pulses 138, i.e., $V_{SL}$ for reset pulses 138, and/or the word line voltage $V_{WL}$ on word lines 108 or current limit $I_{LIM}$. Any of these conditions, or parameters for these conditions, could be controlled singly, or two or more of these could be controlled in combination, as the adjusted write condition, in various embodiments. For example, subjecting the selected RRAM cell to a longer set pulse, a greater number of set pulses, a greater voltage or a greater current could grow or form more material into the resistive filament, producing a lower resistance value for the LRS. Subjecting the selected RRAM cell to a shorter set pulse, a lesser number of set pulses, a lower voltage or a lower current could grow or form less material into the resistive filament, producing a higher resistance value for the LRS. Subjecting the selected RRAM cell to a longer reset pulse, a greater number of reset pulses, a greater voltage or greater current could more quickly or more thoroughly break the resistive filament, producing a higher resistance value for the HRS. Subjecting the selected RRAM cell to a shorter reset pulse, a lesser number of reset pulses, a lower voltage or a lower current could less thoroughly or less completely break the resistive filament, producing a lower resistance value for the HRS.

For a given condition to be adjusted, the condition trends either in the same direction or the opposite direction from whichever characteristic is measured as a proxy for resistance of the RRAM cell. Thus the determination of which way to adjust a given condition according to the relative value of the measured characteristic is specific to the condition(s) to be adjusted and the choice of measured characteristic. An RRAM cell that should be in the HRS state but which has undesirably low resistance, or that is in the LRS state to be written to the HRS state but which has very low resistance even for the LRS state, should receive an adjusted write condition to appropriately raise the resistance more so than such a cell that has a higher resistance. An RRAM cell that should be in the LRS state but which has undesirably high resistance, or that is in the HRS state to be written to the LRS state but which has very high resistance even for the HRS state should receive an adjusted write condition to appropriately lower the resistance more so than such a cell that has a lower resistance.

In some embodiments, the selected RRAM cell is read, and then written to only if the desired write value differs from the read value, i.e., only written to change the programmed digital value of the RRAM cell. In other embodiments, the selected RRAM cell is written to for the above reasons and also in case of need of adjusting, trimming, "tuning up" or otherwise changing the resistance even if the write value is the same as the read value for the RRAM cell.

Figure 2:
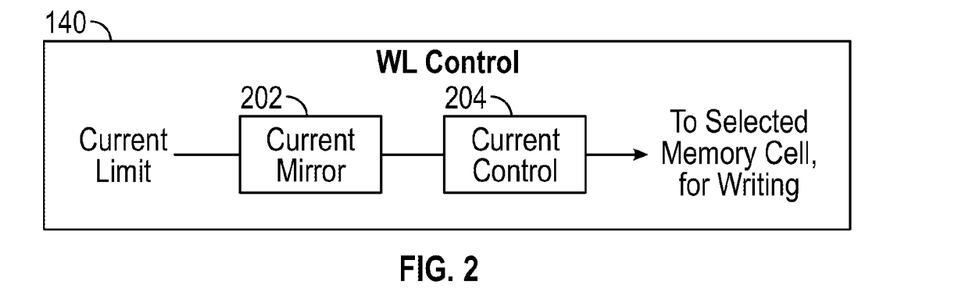
FIG. 2 illustrates a current mirror and current control which can be used in the word line control of FIG. 1.

FIG. 2 illustrates a current mirror 202 and current control 204 which can be used in the word line control 140 of FIG. 1. The current mirror 202 reproduces or mirrors the current limit $I_{LIM}$, controlled by current limit control 304 $I_{LIM}$ control (see FIG. 3) for the selected memory cell, i.e., the selected resistor 104 in the RRAM cell. Various analog circuits for current mirroring are readily devised. The current control 204 produces an output based on the current mirror 202, which is then used for controlling current in the selected RRAM cell. In one embodiment, the current control 204 produces the word line voltage, which is used for the selected word line from the word line drivers 120.

Figure 3:
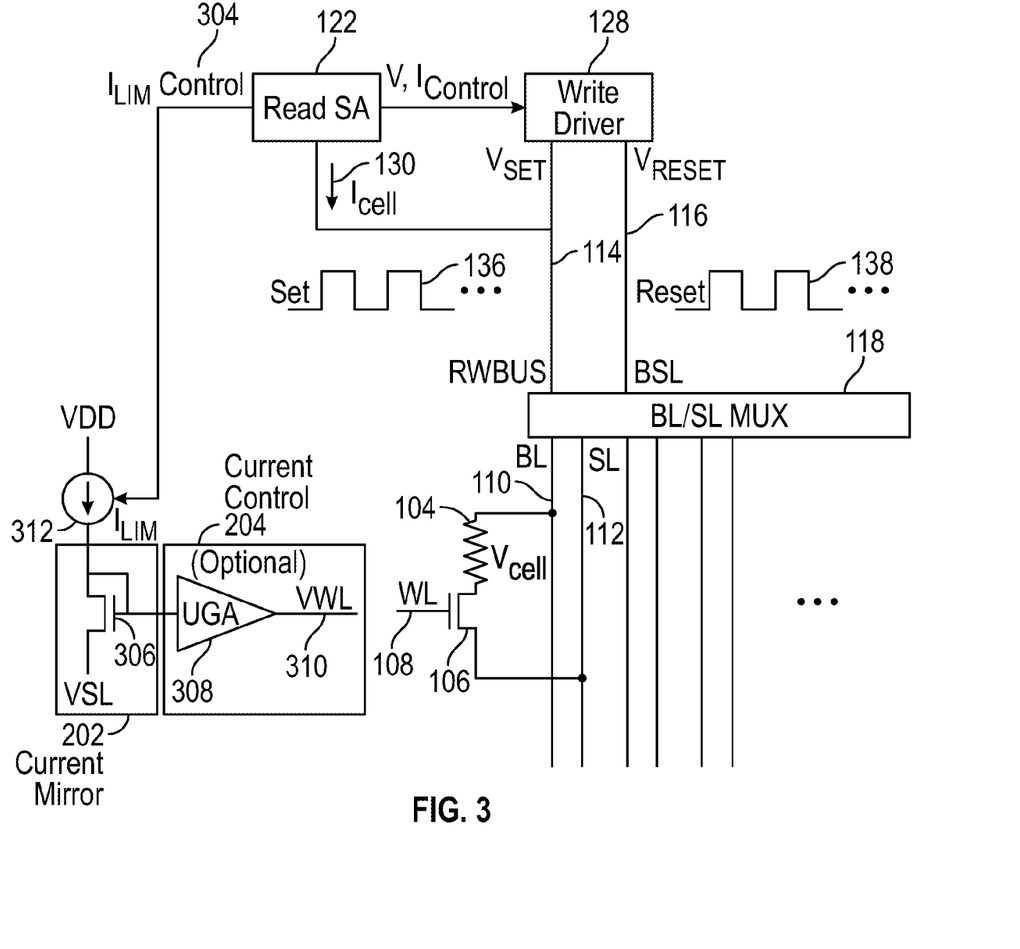
FIG. 3 illustrates an analog feedback circuit that controls word line voltage in order to limit current in a selected RRAM cell, which can be used in embodiments of the RRAM array with write control.

FIG. 3 illustrates an analog feedback circuit that controls word line voltage in order to limit current in a selected RRAM cell, which can be used in embodiments of the RRAM array 102 with write control 142. In this embodiment, the read sense amplifier 122 (which could be the combined measurement circuit/read sense amplifier 132) produces a current limit control 304 $I_{LIM}$ control, which drives a controlled current source 312. Controlled current source 312 produces the current limit $I_{LIM}$. A transistor 306, in this version an NMOS FET connected as a pseudo-diode is operated as an current mirror 202 to mirror the current limit $I_{LIM}$, with the gate of the FET (and therefore, gate voltage) connected to a unity gain amplifier 308 to produce the word line voltage 310 $V_{WL}$. In some versions, the unity gain amplifier 308 is omitted and the output of the current mirror (e.g., gate voltage of the FET) drives the word line voltage directly. With the selected word line 108 driven by the word line voltage 310, current through the selected RRAM cell (and corresponding resistor 104 in the selected RRAM cell) is controlled and limited by the current limit $I_{LIM}$ according to the controlled current source 312 as directed by the current limit control 304. The word line voltage 310 thus provides the current control 204 (see FIG. 2) to the gate of the transistor 106 in the selected RRAM cell, in various embodiments. Other mechanisms for controlling current through the resistor 104 and the selected RRAM cell could be devised in keeping with the teachings herein, for various transistor technologies.

In one embodiment, a high cell current 130 through the selected RRAM cell is a cell characteristic indicative of lower resistance of the resistor 104, and a low cell current 130 through the selected RRAM cell is a cell characteristic indicative of higher resistance of the resistor 104. Current limit control 304 is adjusted accordingly, so that the next write to the selected RRAM cell has an appropriate current limit based on the resistance of the RRAM cell from the previous programmed state.

Figure 4:
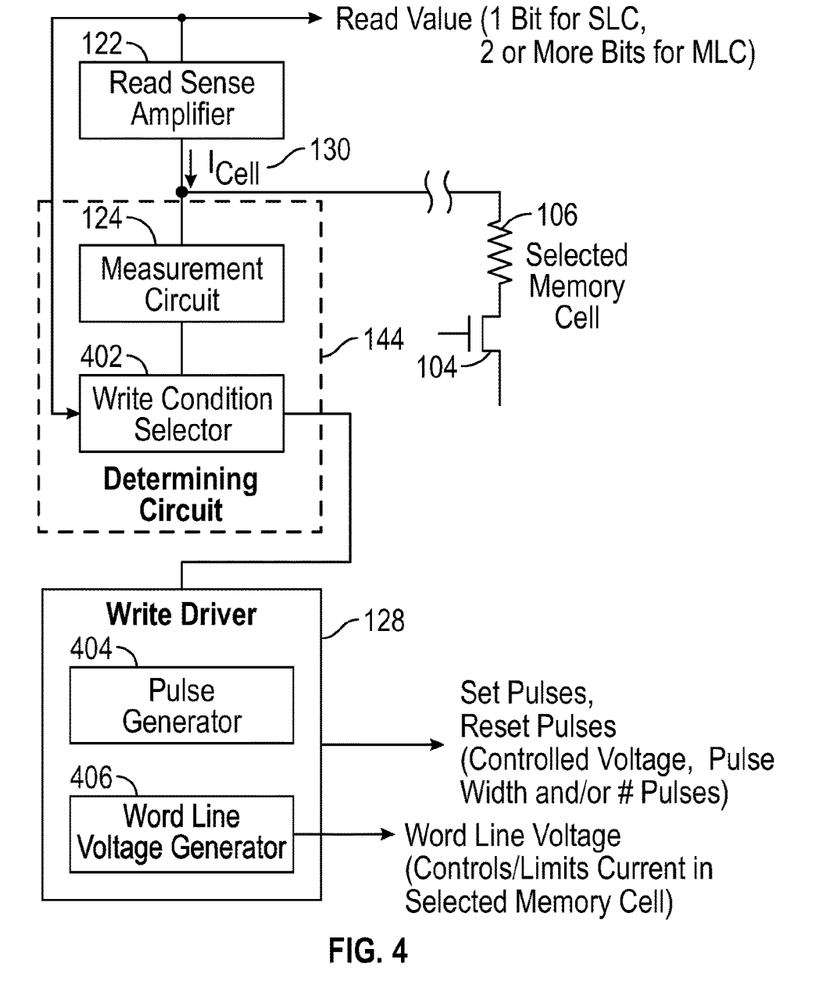
FIG. 4 is a block diagram for variations of the write control system and circuitry of FIGS. 1-3, according to an embodiment.

FIG. 4 is a block diagram for variations of the write control system and circuitry of FIGS. 1-3. The read sense amplifier 122 connects to the selected memory cell (e.g., RRAM cell, or other type of memory cell for other memory technologies), for example through multiplexing and selection logic, and generates the read value for the selected memory cell, based on cell current 130 and/or voltage of the selected memory cell during read conditions. A measurement circuit 124 similarly connects to the selected memory cell and/or connects to the read sense amplifier 122, and measures or determines a cell characteristic that is indicative of the resistance of the selected memory cell. This cell characteristic is, in various embodiments, a digital or analog value equaling or proportional to cell current, cell voltage, ratio or inverse ratio of cell voltage to cell current, or sense time for reading the RRAM cell. Output of the measurement circuit and, in some embodiments output of the read sense amplifier, connects to the write condition selector 402. Based on these inputs, the write condition selector 402 selects (or adjusts) a write condition for the write driver 128. In some embodiments, a determining circuit 144 determines the write condition, based on a measurement relating to resistance of the selected memory cell, of a state previously written to the memory cell. The determining circuit 144 could include the write condition selector 402, and further include the measurement circuit 124 as shown in FIG. 4, the measurement circuit/read sense amplifier module 132 as shown in FIG. 1, the lookup table and logic as will be described with reference to FIG. 5, or other analog, digital or mixed circuitry as readily devised in keeping with the teachings herein.

The write driver 128 includes a pulse generator 404 and a word line voltage generator 406. Set pulses and reset pulses are produced by the pulse generator 404, with controlled voltage, pulse width and/or number of pulses. Word line voltage is produced by the word line voltage generator 406, and controls or limits current in the selected memory cell. The write driver 128 is thus adjustable as to write condition, according to the write condition selector 402. Various embodiments have various combinations of the above features.

In one embodiment of the determining circuit 144 and the write driver 128, an RRAM cell in a high resistance state but with resistance at the lower end of the HRS resistance range receives a weaker set condition from the write driver 128. An RRAM cell in a high resistance state but with resistance at the higher end of the HRS resistance range receives a stronger set condition from the write driver 128. An RRAM cell in a low resistance state but with resistance at the lower end of the LRS resistance range receives a stronger reset condition from the write driver 128. And, an RRAM cell in a low resistance state but with resistance at the higher end of the LRS resistance range receives a weaker reset condition from the write driver 128.

Figure 5:
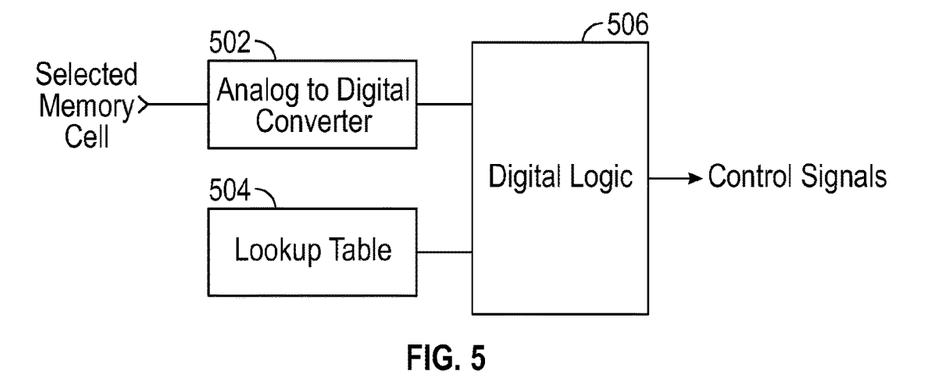
FIG. 5 is a block diagram for an analog-to-digital converter and digital circuitry that generates control signals for embodiments of the write control system, according to an embodiment.

FIG. 5 is a block diagram for an analog-to-digital converter 502 and digital circuitry that generates control signals for embodiments of the write control system. With reference back to FIG. 1, FIG. 5 shows circuitry for a lookup table-based embodiment that generates control signals for timing/pulse control 126 and/or write control 142, or other signals that control and adjust the write condition for the selected RRAM cell. The analog-to-digital converter 502 connects to the selected memory cell, for example through multiplexing and selection logic, and produces a digital value for the measurement of the memory cell characteristic. For example, this could be a digital value for the cell current 130 or cell voltage for the RRAM cell, or both. Digital logic 506, which could include state machine, a controller, a processor, or logic gates, accesses a lookup table 504 and produces control signals from results of using the lookup table. The lookup table 504 could be populated with values for memory cell current, memory cell voltage, timing for the pulse generator 404 (see FIG. 4), word line voltage, current limit, etc., for values or ranges of values for the memory cell characteristic. Entries for the lookup table 504 could be determined using tester or laboratory characterization of RRAM cells, or developed or updated during operation of the RRAM array 102, e.g., using heuristics, in various embodiments.

Figure 6A:
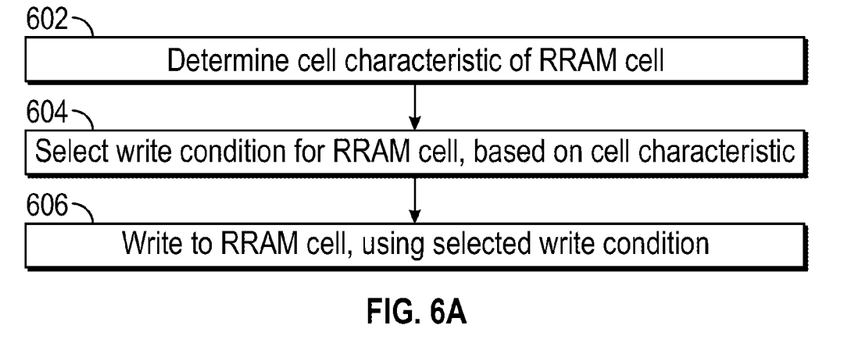
FIG. 6A is a flow diagram of a method for writing to an RRAM cell, according to an embodiment of a write control system.

FIG. 6A is a flow diagram of a method for writing to an RRAM cell, which can be practiced by embodiments of the write control system. Analog versions, digital versions, and mixed analog and digital versions are envisioned for performing the operations of the method.

In an operation 602, a cell characteristic of an RRAM cell is determined. The cell characteristic relates to resistance of the RRAM cell, and could be a measurement of, proportional to, or derived from, for example, cell current, cell voltage, cell resistance, sense time, or the inverse of one of these. For example, measurement circuit 124 in FIG. 1 or FIG. 4 could measure cell current and/or cell voltage for the selected RRAM cell. The analog-to-digital converter 502 in FIG. 5 could measure and convert one or more of the above-described characteristics from an analog value to a digital value for use in digital circuitry, or the analog value could be used in analog circuitry, or both.

In an operation 604, a write condition is selected for the RRAM cell based on the cell characteristic. The write condition could be derived by analog feedback as shown in FIGS. 1, 2 and 3, digital calculation, look up in a lookup table as shown in FIG. 5, or combination, for example. The write condition could be a voltage polarity, a voltage level, a timing of a pulse, the timing of multiple pulses, the number of pulses, a current or a current limit, for writing to the RRAM cell, or a combination thereof. Examples of pulse voltage, width and number are shown in FIG. 4. Current and current limit for the RRAM cell, and mechanisms for controlling current, are shown in FIGS. 1-4.

In an operation 606, the RRAM cell is written to, using the selected write condition. For example, the write condition could be used for controlling one or more pulses from a pulse generator as shown in FIG. 4, voltage or current to the selected RRAM cell, word line voltage as shown in FIGS. 1-4, or a combination thereof.

Figure 6B:
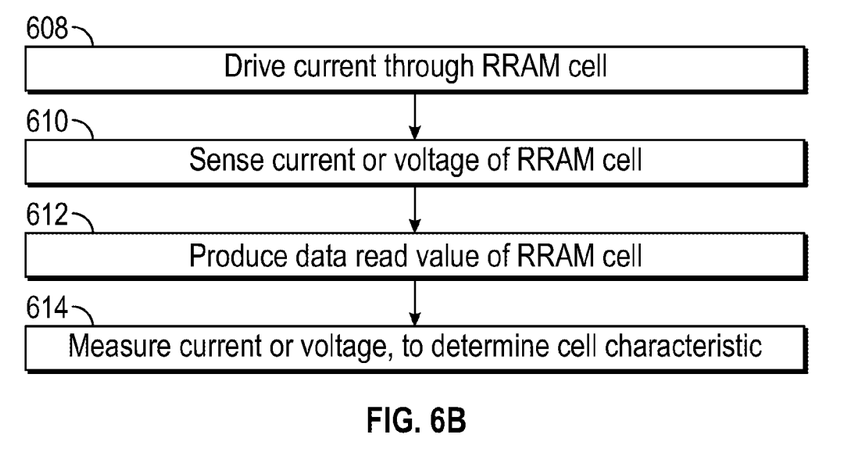
FIG. 6B is a flow diagram of a further method for writing to an RRAM cell, according to an embodiment of a write control system.

FIG. 6B is a flow diagram of a further method for writing to an RRAM cell, which can be practiced by embodiments of the write control system. This method is used for determining a cell characteristic of an RRAM cell.

In an operation 608, a current is driven through the RRAM cell. For example, the current could be supplied by a read sense amplifier that applies a read voltage to the RRAM cell, or otherwise provides or drives a current through the selected RRAM cell. In some embodiments, cell resistance determines the current that may be supplied by the sense amplifier. See for example the read sense amplifier 122 in FIGS. 1, 3 and 4.

In an operation 610, the current or the voltage of the RRAM cell is sensed. For example, the current or voltage could be sensed by the read sense amplifier, as shown in FIGS. 1, 3 and 4.

In an operation 612, a data read value of the RRAM cell is produced, as shown in FIG. 4. The data read value is produced based on sensing the current or voltage of the RRAM cell in the operation 610.

In an operation 614, the current or voltage is measured, to determine the cell characteristic. The measurement should be to a finer resolution than the read value. For example, a measurement circuit such as shown in FIGS. 1 and 4, an analog-to-digital converter 502 as shown in FIG. 5, or combined measurement circuit/read sense amplifier 132 as shown in FIG. 1 could be used.

Figure 6C:
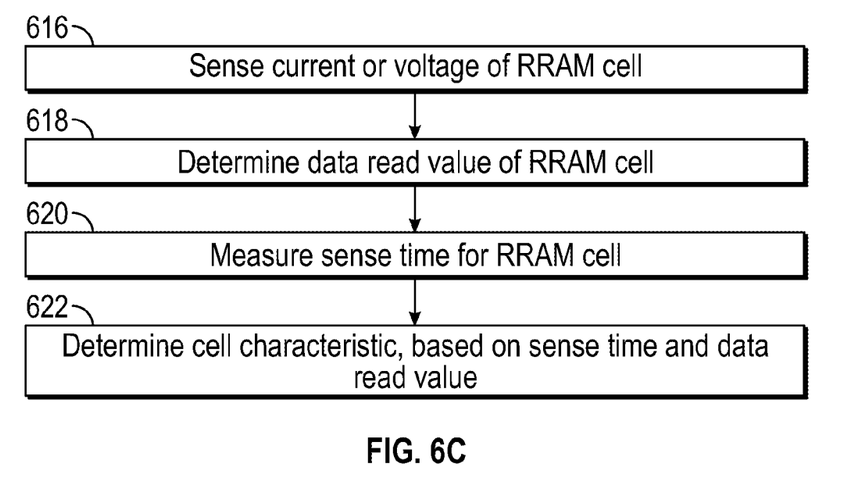
FIG. 6C is a flow diagram of a further method for writing to an RRAM cell, according to an embodiment of a write control system.

FIG. 6C is a flow diagram of a further method for writing to an RRAM cell, which can be practiced by embodiments of the write control system. This method is used for determining a cell characteristic of an RRAM cell, in further embodiments.

In an operation 616, current or voltage of the RRAM cell is sensed. For example, the current or voltage could be sensed by the read sense amplifier. The read sense amplifier is shown in FIGS. 1, 3 and 4.

In an operation 618, a data read value of the RRAM cell is determined. For example, the data read value can be determined by the read sense amplifier as shown in FIG. 4.

In an operation 620, the sense time for the RRAM cell is measured.

Measurement of sense time could be performed by the read sense amplifier, or by a measurement circuit. Sense time for reading the RRAM cell is described with reference to FIGS. 1 and 4. Sense time, in some embodiments, can be defined as the response time of the read sense amplifier to determine the characteristic or state of the cell that is read using specific conditions. As an example, one type of sense amplifier may bias the bitline/cell to a read voltage and compare the resulting current to a reference current with the difference in current charging or discharging a node to trigger an output node change. This embodiment is to use this time or delay to feed back to determine the write conditions.

In an operation 622, the cell characteristic is determined, based on the sense time and the data read value. One embodiment omits the operation 618, and determines the write condition (in operation 622) only on the sense time of the cell.

Figure 6D:
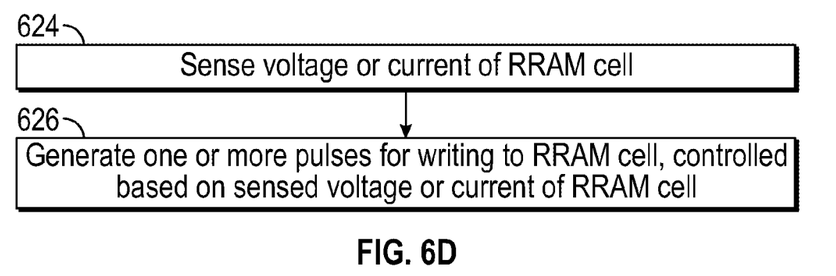
FIG. 6D is a flow diagram of a further method for writing to an RRAM cell, according to an embodiment of a write control system.

FIG. 6D is a flow diagram of a further method for writing to an RRAM cell, which can be practiced by embodiments of the write control system. This method is used for controlling the write condition for the RRAM cell.

In an operation 624, the voltage or current of the RRAM cell is sensed. For example, the voltage or current to be sensed by the read sense amplifier. The read sense amplifier is shown in FIGS. 1, 3 and 4.

In an operation 626, one or more pulses are generated, for writing to the RRAM cell. The one or more pulses are controlled based on the sensed voltage or current of the RRAM cell. Set and reset pulses with timing and pulse control are shown in FIG. 1, and a pulse generator that could be suitably controlled is shown in FIG. 4.

Figure 6E:
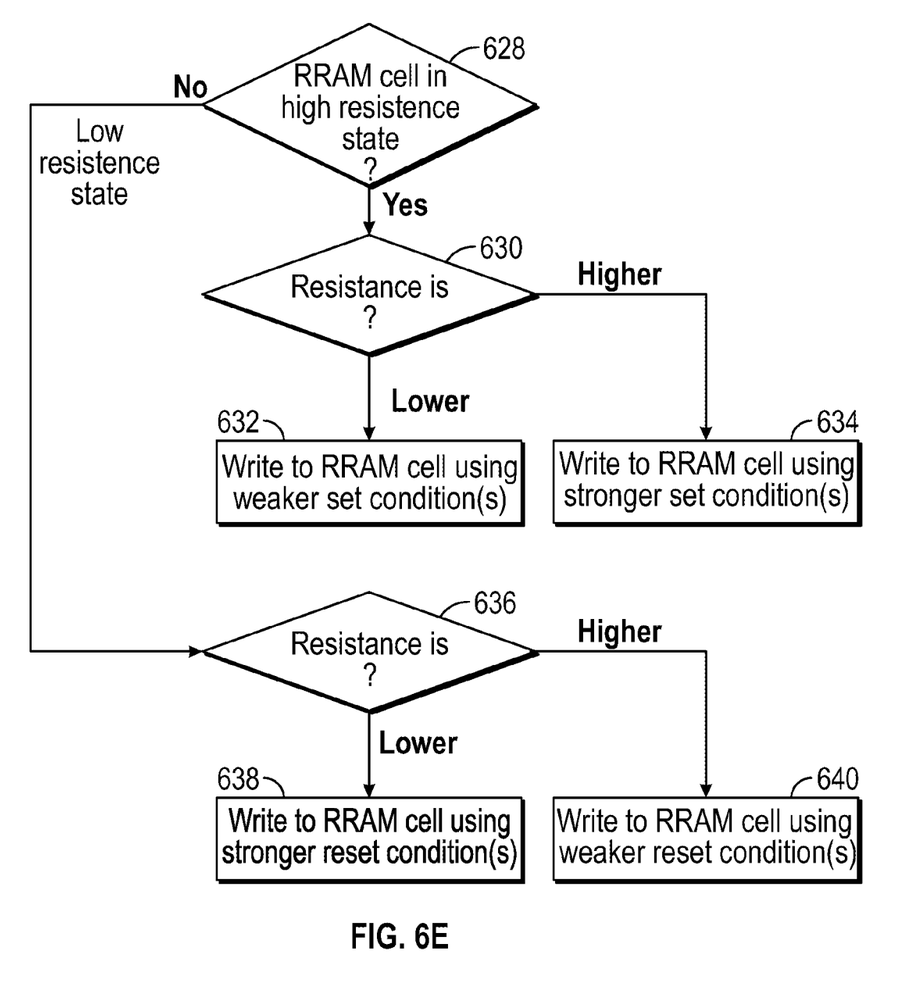
FIG. 6E is a flow diagram of a further method for writing to an RRAM cell, according to an embodiment of a write control system.

FIG. 6E is a flow diagram of a further method for writing to an RRAM cell, which can be practiced by embodiments of the write control system. This method is an embodiment of dependency of the write condition on the cell characteristic of the RRAM cell.

In a decision operation 628, it is determined whether the selected RRAM cell is in a high resistance state. If the RRAM cell is in a high resistance state, flow proceeds to the decision operation 630. If the RRAM cell is in a low resistance state, flow proceeds to the decision operation 636.

In a decision operation 630, it is determined whether the resistance of the selected RRAM cell in the high resistance state is relatively lower or higher. If the resistance is lower, e.g., than a threshold, flow proceeds to the operation 632. If the resistance is higher, flow proceeds to the operation 634. Relative resistance can be determined by proxy, through the measured cell characteristic.

In the decision operation 636, it is determined whether the resistance of the selected RRAM cell in the low resistance state is relatively lower or higher. If the resistance is lower, e.g., than a threshold, flow proceeds to the operation 638. If the resistance is higher, flow proceeds to the operation 640.

In an operation 632, a high resistance state RRAM cell that has lower resistance is written to using weaker set condition(s).

In an operation 634, a high resistance state RRAM cell that has higher resistance is written to using stronger set condition(s).

In an operation 638, a low resistance state RRAM cell that has lower resistance is written to using stronger reset condition(s).

In an operation 640, a low resistance state RRAM cell that has higher resistance is written to using weaker reset condition(s).

The above description of illustrated embodiments of the disclosure, including what is described in the Abstract, is not intended to be exhaustive or to limit the disclosure to the precise forms disclosed. While specific embodiments of, and examples for, the disclosure are described herein for illustrative purposes, various equivalent modifications are possible within the scope of the disclosure, as those skilled in the relevant art will recognize. Other embodiments may have layers in different orders, additional layers or fewer layers than the illustrated embodiments.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer deposited above or over or under another layer may be directly in contact with the other layer or may have one or more intervening layers. Moreover, one layer deposited between two layers may be directly in contact with the two layers or may have one or more intervening layers. In contrast, a first layer "on" a second layer is in direct contact with that second layer. Similarly, unless explicitly stated otherwise, one feature deposited between two features may be in direct contact with the adjacent features or may have one or more intervening layers.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. The terms "first," "second," "third," "fourth," etc. as used herein are meant as labels to distinguish among different elements and may not necessarily have an ordinal meaning according to their numerical designation.

What is claimed is:

1. A memory device comprising:
   an array of memory cells connected by a plurality of bit lines;
   a read sense circuit to apply a voltage to a selected memory cell of the array of memory cells and sense a current resulting from the application of the voltage, wherein the read sense circuit applies the voltage and senses the current through a bit line of the plurality of bit lines, wherein the bit line is associated with the selected memory cell;
   a measurement circuit, connected to the bit line associated with the selected memory cell, to measure a resistance associated with the selected memory cell based on the sense current; and
   a write condition selector circuit to determine, based on the resistance associated with the selected memory cell, one or more pulses to be transmitted to the selected memory cell through the bit line, wherein the one or more pulses cause a change to a resistive filament of the selected memory cell.

2. The memory device of claim 1, wherein the array of memory cells comprises random access memory (RRAM) cells.

3. The memory device of claim 1, wherein the read sense circuit is a read sense amplifier, wherein the read sense amplifier directly measures the current resulting from the application of the voltage.

4. The memory device of claim 1, wherein the write condition selector circuit determines a number of the one or more pulses to be transmitted to the selected memory cell based on the resistance associated with the selected memory cell.

5. The memory device of claim 1, wherein the write condition selector circuit determines pulse widths of the one or more pulses to be transmitted to the selected memory cell based on the resistance associated with the selected memory cell and limits currents associated with the one or more pulses as seen by the selected memory cell.

6. The memory device of claim 1, further comprising:
a write driver coupled to the write condition selector circuit.

7. The memory device of claim 6, wherein the write driver generates the one or more pulses to be transmitted to the selected memory cell.

8. The memory device of claim 7, wherein the one or more pulses are generated by a pulse generator of the write driver.

9. The memory device of claim 6, wherein the write driver generates a word line voltage signal to limit the currents associated with the one or more pulses as seen by the selected memory cell.

10. The memory device of claim 9, wherein the currents associated with the one or more pulses are limited by a wordline voltage generator of the write driver.

11. The memory device of claim 5, wherein the write condition selector circuit comprises:
a logic;
a memory storing a lookup table accessible to the logic; and
an analog to digital (A/D) converter, wherein an output of the A/D converter is coupled to an input of the logic and an input of the A/D converter is coupled to the selected memory cell.

12. The memory device of claim 11, wherein the input of the A/D converter is coupled to the selected memory cell through at least one multiplexer.

13. The memory device of claim 11, wherein the logic includes logic gates implementing a state machine.

14. The memory device of claim 13, wherein the lookup table stores data relating to memory cell current, memory cell voltage, timing, word line voltage, and current limit.

15. The memory device of claim 14, wherein the memory cell current, memory cell voltage, timing, word line voltage, and current limit are determined based on operations of the array of memory cells.

16. The memory device of claim 14, wherein the A/D converter outputs a digital value to the logic based on the resistance associated with the selected memory cell.

17. The memory device of claim 16, wherein the logic generates a control signal to the write driver to generate the one or more pulses based on the digital value outputted by the A/D converter using the lookup table.

18. The memory device of claim 16, wherein the logic generates a control signal to the write driver to generate a word line voltage signal to limit the currents associated with the one or more pulses based on the digital value outputted by the A/D converter using the lookup table.

19. The memory device of claim 1, wherein:
the selected memory cell is a single level cell;
data stored in the selected memory cell is one bit; and
a resistance measurement relating to the resistance associated with the selected memory cell is an analog value or a digital value having greater than one bit.

20. The memory device of claim 1, wherein:
the selected memory cell is a multilevel cell;
data stored in the selected memory cell is at least two bits; and
a resistance measurement relating to the resistance associated with the selected memory cell is an analog value or a digital value having a number of bits greater than the at least two bits.

* * * * *